United States Patent
Lewis-Gray et al.

(10) Patent No.: US 12,038,401 B2
(45) Date of Patent: Jul. 16, 2024

(54) WEAR SENSOR SYSTEM

(71) Applicant: GEKKO SYSTEMS PTY LTD., Victoria (AU)

(72) Inventors: Alexander Hamilton Lewis-Gray, Blowhard (AU); Richard David Goldberg, Balarat East (AU); Md Shamsul Arefin, Noble Park (AU); Abbas Zahedi Kouzani, Highton (AU)

(73) Assignee: GEKKO SYSTEMS PTY LTD., Victoria (AU)

(*) Notice: Subject to any disclaimer, the term of this patent is extended or adjusted under 35 U.S.C. 154(b) by 389 days.

(21) Appl. No.: 17/293,511

(22) PCT Filed: Nov. 13, 2019

(86) PCT No.: PCT/AU2019/000140
§ 371 (c)(1),
(2) Date: May 13, 2021

(87) PCT Pub. No.: WO2020/097659
PCT Pub. Date: May 22, 2020

(65) Prior Publication Data
US 2022/0003707 A1    Jan. 6, 2022

(30) Foreign Application Priority Data
Nov. 13, 2018 (AU) ................. 2018904316

(51) Int. Cl.
*G01N 27/22* (2006.01)
*G01N 27/04* (2006.01)
(Continued)

(52) U.S. Cl.
CPC ............. *G01N 27/22* (2013.01); *G01N 27/04* (2013.01); *H04B 1/40* (2013.01); *H04Q 9/00* (2013.01);
(Continued)

(58) Field of Classification Search
CPC .......... G01N 27/22; G01N 27/04; G01N 3/56; G01N 2203/0617; G01N 27/24;
(Continued)

(56) References Cited

U.S. PATENT DOCUMENTS 11,856,344 B2 * 12/2023 Rijns ................. H02J 50/00
2007/0030154 A1   2/2007 Aiki
(Continued)

OTHER PUBLICATIONS

International Search Report mailed in corresponding International Patent Application No. PCT/AU2019/000140 on Jan. 29, 2020, consisting of 5 pp.

*Primary Examiner* — Giovanni Astacio-Oquendo
(74) *Attorney, Agent, or Firm* — Volpe Koenig (57) ABSTRACT

The present invention is a wear sensing and monitoring system including:
 at least one sensor node, and
 wireless communication means, and
 a gateway node, and
 a remote monitoring and management node,
 wherein the wireless communication means are adapted to enable the at least one sensor node to have at least one-way wireless communication from the node to the gateway node. The gateway node is adapted to have at least one way wired or wireless communication from the gateway node to the remote monitoring and management node. Note that the two nodes may be included in the one device.

17 Claims, 11 Drawing Sheets

(51) Int. Cl.
*H04B 1/40* (2015.01)
*H04Q 9/00* (2006.01)
*H10N 30/30* (2023.01)
*H04W 88/16* (2009.01)

(52) U.S. Cl.
CPC ......... *H10N 30/30* (2023.02); *H04Q 2209/40* (2013.01); *H04W 88/16* (2013.01)

(58) Field of Classification Search
CPC . G01N 27/20; H04B 1/40; H04Q 9/00; H04Q 2209/40; H04Q 2209/88; H10N 30/30; H04W 88/16; F16D 66/024; F16D 66/027; G08C 17/02
USPC .......................................... 324/654, 649, 600
See application file for complete search history.

(56) References Cited

U.S. PATENT DOCUMENTS

| | | |
|---|---|---|
| 2012/0043980 A1 | 2/2012 | Davies |
| 2014/0103940 A1* | 4/2014 | Izrailit ................... G01N 27/02 |
| | | 324/649 |
| 2016/0266021 A1* | 9/2016 | Moon ..................... F16L 57/06 |
| 2016/0326723 A1 | 11/2016 | Behmlander |
| 2018/0066804 A1* | 3/2018 | Grumstrup ............ G01N 1/2247 |
| 2020/0041433 A1* | 2/2020 | Brunner ................... H04Q 9/00 |
| 2020/0359114 A1* | 11/2020 | Gokan ..................... H04Q 9/00 |

\* cited by examiner

Figure 9 ial applications to improve safety as well as reducing operating costs. If the surfaces of machines, where the frictional contacts are made, are remote or enclosed, it is difficult to assess the surface wear before a machine breaks down.

WEAR SENSOR SYSTEM

FIELD OF THE INVENTION

The present invention relates to wear monitoring systems for use in components that are subjected to wear in industrial apparatuses.

BACKGROUND OF THE INVENTION

Wear measurements are crucial in industrial applications to improve safety as well as reducing operating costs. If the surfaces of machines, where the frictional contacts are made, are remote or enclosed, it is difficult to assess the surface wear before a machine breaks down.

Preventative maintenance programs are typically implemented to try and avoid catastrophic failure of the wear component. If the maintenance program is overly aggressive, then the apparatus that includes the component that is subjected to the wear will be taken out of service more often than is required. Alternatively, if the preventative maintenance program is not aggressive enough, or there is a change in the properties of the material that the apparatus is processing, then the component may fail prior to the maintenance program being implemented on that apparatus. The result of this is a lack of operational efficiency for that apparatus that may have a flow on effect across the entire plant, particularly if that apparatus is on the critical path.

It is therefore an objective of the present invention to provide a wear sensing and monitoring system that at least ameliorates the aforementioned problems.

DISCLOSURE OF THE INVENTION

Accordingly, in one form, the present invention is a wear sensing and monitoring system including:
  at least one sensor node, and
  wireless communication means, and
  a gateway node, and
  a remote monitoring and management node,
  the wireless communication means are adapted to enable the at least one sensor node to have at least one-way wireless communication from the node to the gateway node. The gateway node is adapted to have at least one way wired or wireless communication from the gateway node to the remote monitoring and management node.

Preferably, a plurality of sensor nodes are releasably installable into a particular apparatus, and each sensor node is adapted to have at least one-way wireless communication from the particular sensor node to the gateway.

Preferably, each sensor node, in the plurality of sensor nodes, includes a unique identification means that enables the particular sensor node to be identified by the remote monitoring and management node.

Preferably, the communication means are wireless.
Preferably, the gateway node includes:
  a transceiver circuit, and
  data processing and control means, and
  a cellular modem, and
  an antenna,
  wherein the transceiver circuit is adapted to receive the at least one-way wireless communication from the at least one sensor node, and wherein the data processing and control means are adapted to process the data emanating from the at least one sensor node and pass that processed data to the remote monitoring and management node via the cellular modem and antenna.

Preferably, the sensor node includes:
  a body, and
  at least one antenna, and
  a circuit board, and
  at least one microcontroller chip, and
  at least one power supply, and
  a wear sensor,
  wherein the body wholly contains the at least one antenna, and the circuit board, and the at least one microcontroller chip, and the at least one power supply, and the wear sensor. The body includes releasable fastening means that are adapted to enable the node to be installable and removable from the apparatus.

Preferably, the sensor node includes:
  a plurality of discrete resistors, and
  a plurality of capacitors or inductors, and
  wherein a particular resistor in the plurality of discrete resistors and a particular capacitor or inductor in the plurality of capacitors or inductors are electrically coupled with one another in a ladder arrangement. Each of the resistors, capacitors or inductors are mounted upon a printed circuit board. The printed circuit board is adapted to be subjected to physical wear during the operation of the apparatus. As the printed circuit board physically wears away, individual resistors, or capacitors or inductors are decoupled from the electrical circuit thereby, resulting in a corresponding voltage change in the sensor node, and the voltage change is monitored by the gateway node as indicative of the wear of the element upon which the sensor node is releasably fastened to.

Preferably, the sensor node includes:
  a plurality of discrete resistors, and
  a plurality of capacitors or inductors, and
  wherein a particular resistor in the plurality of discrete resistors and a particular capacitor or inductor in the plurality of capacitors or inductors are electrically coupled with one another in a ladder arrangement by individual electrical connections. Each of the resistors, capacitors or inductors are mounted upon a printed circuit board. The printed circuit board is adapted to be subjected to physical wear during the operation of the apparatus. As the printed circuit board physically wears away, at least one of the individual electrical connections coupling either a resistor, and/or capacitor, and/or inductor are physically broken, thereby resulting in a corresponding change in the sensor node's overall resistance, and/or capacitance, and/or inductance, and this change is monitored by the gateway node as indicative of the wear of the element upon which the sensor node is releasably fastened to.

Preferably, the physical wear on the printed circuit board is progressive, and as the wear progresses along the printed circuit board, individual components, or electrical connectors are broken or decoupled, thereby providing the sensor node with a plurality of either resistive, and/or capacitive, and or inductive states, and these state changes are communicated with and monitored by the gateway node and used to determine the wear state of the particular component within the apparatus.

Preferably, the sensor node includes a nest of conductive wire loops and each loop within the nest of conductive wire loops includes multiple series and parallel connected electrical components. The nest of conductive wire loops are arranged so that each of the conductive wire loops are physically disabled in sequence, by the abrasion, starting with the outermost conductive wire loop, so that as the abrasive wear continues, the resistance increases monotonically, and a direct current source applied to the sensor node correspondingly makes the voltage change by the increase in resistance, and this is measured by the gateway node and is used by the gateway node to determine the wear state of that particular component within the apparatus.

Preferably, the sensor node includes a nanotechnology based resistive loop wherein said resistive loop is fabricated on a standard silicon or glass wafer by depositing different materials using nano fabrication techniques such as conventional e-Beam evaporation, or sputtering, or Plasma-enhanced chemical vapor deposition (PECVD) techniques to fabricate nano-resistors at discrete locations along a plurality of electrical connection lines, thereby eliminating the need to use comparatively larger conventional resistor components.

Preferably, the electrical connection lines are comparatively much smaller than conventional electrical connection lines when using conventional resistor components, and thereby said more electrical connection lines are able to be more densely packed within the sensor node so that the sensor node has many more resistive states as the sensor node physically wears away, and said many more resistive states is able to be monitored by the gateway node to determine more accurate wear information for that particular sensor node.

Preferably, the at least one power supply includes Piezoelectric material. The at least one power supply is adapted to generate a sufficient electrical current to run the electronics incorporated within the sensor node by converting vibratory oscillations generated by the operation of the apparatus into electrical power.

Preferably, in a preferred embodiment, the body of the sensor node is shaped like a bolt, with a head portion and a shank portion, and wherein the releasable fastening means are included on the shank portion.

Preferably, the releasable fastening means includes an external thread that is adapted to screw into a complimentary hole with a corresponding internal thread in the apparatus.

Preferably, the at least one antenna, printed circuit board, and the at least one microcontroller chip are contained within the head portion of the body.

Preferably, the sensor node includes an analogue to digital converter that is adapted to measure the voltage levels that correspond to the individual sensor's wear state.

Preferably, the gateway node includes power management means that are adapted to autonomously energise and de-energise the sensor node interface and/or the cellular modem to minimise power consumption, and thereby if/when said gateway node is running on battery power, then the time between battery recharges is maximised.

Preferably, the sensor node includes a microcontroller that is adapted to energise the gateway node at pre-set intervals and transmit sensor data to the remote monitoring and management node.

DESCRIPTION OF EXAMPLES OF THE INVENTION AND THE PREFERRED EMBODIMENT

Figure 1:
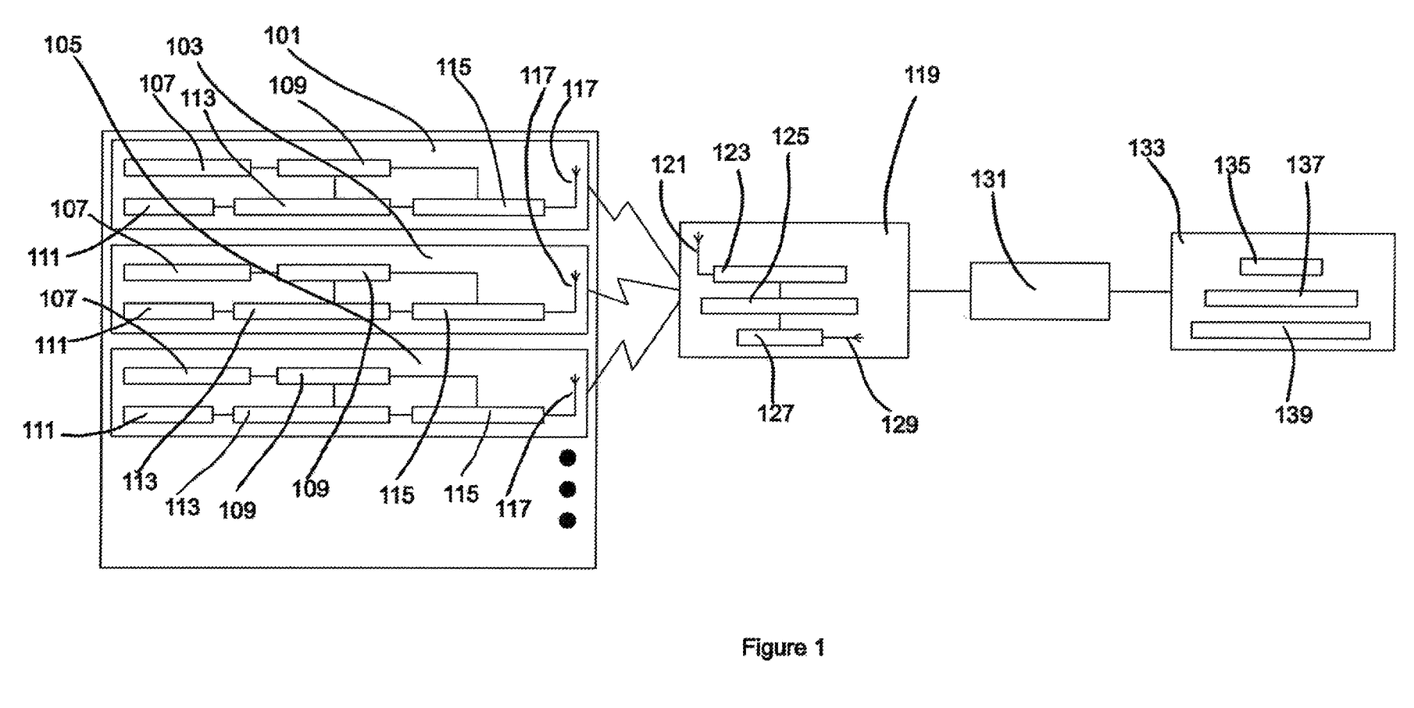
FIG. 1 is a schematic of the wear sensing and monitoring system in accordance with the present invention.

A preferred embodiment of a complete wireless wear monitoring system is illustrated in FIG. 1. The system contains several wear nodes 101, 103 and 105 respectively, placed at various wear sites to measure wear states on that particular component within an apparatus. In this illustration, three wear nodes are shown. The three dots indicate that there may be any number of sensor nodes utilised. Each sensor node includes a wear sensor 107 and an energy harvester 111. Each wear sensor 107 is connected to a data processing and control circuit 109. Each energy harvester 111 is connected to an electrical energy storage means 113. Each wear node includes a transceiver circuit 115 that sends and receives data via wireless antenna 117. A separate gateway node 119 communicates with all wear nodes to acquire wear data of various locations and provide control data to the wear nodes. The gateway node 119 comprises antenna 121 and a transceiver circuit 123, a data processing and control circuit 125 and a wireless data modem 127 that may feature 3G and/or 4G wireless communication means. A separate antenna 129 outputs the data from the gateway node 119 to the internet 131 so that the gateway node can communicate with a back-end central node 133 using the 3G/4G modem through internet for storing and processing of wear data. The back-end central node 133 stores data in a webserver 135 and manages a user database 137. The stored data is then accessed by an authorised user through the reporting system 139 for viewing, analysis, and reporting purposes.

In another embodiment, the data is acquired and stored locally and can be viewed locally.

Figure 2:
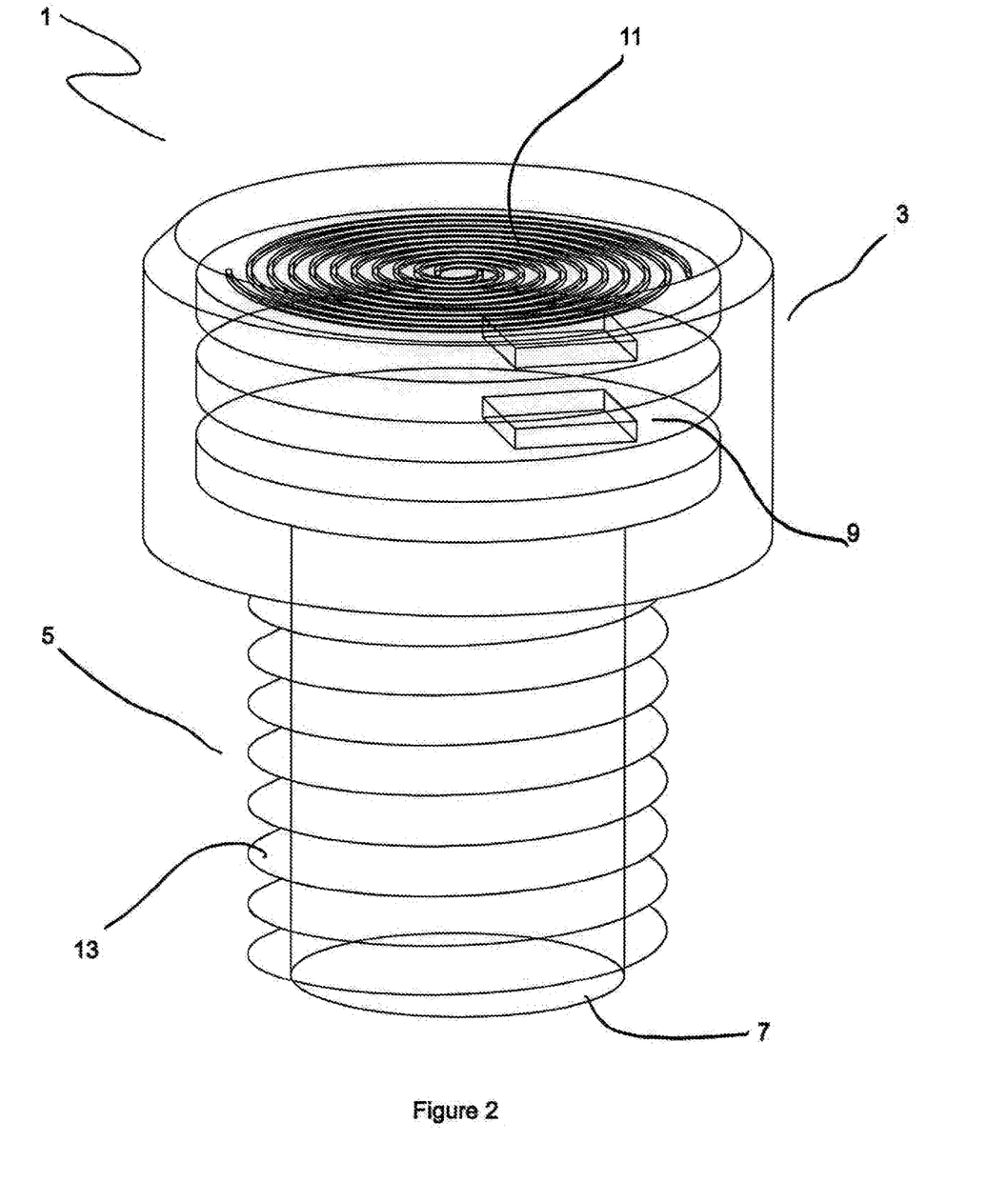
FIG. 2 is an isometric view of one embodiment of a sensor node in accordance with the present invention.

A preferred embodiment of a wear node 1 is shown in FIG. 2. In this embodiment, the wear node 1 is a bolt shaped device having a head portion 3 and a shank portion 5. This type of wear sensor 1 is employed for automatic sensing and wireless reporting of wear status of machines, such as milling, crusher, braking, digging, lifting, and drilling systems but can also be used in any application where wear is present. It features a miniature capsule shaped node suitable for embedding inside wear plates used in quarrying and mining equipment. This node integrates direct wear sensor 7, an integrated circuit 9, an energy harvesting system, an antenna 11, and a screw thread 13. The bottom part of the node contains the wear sensor fabricated on flexible printed circuit board to enable it to wrap inside shank portion 5 wall. The screw thread 13 on the outer wall of the shank portion 5 enables the wear node 1 to releasably fasten the wear node 1 into a predefined internally threaded hole in a component of an apparatus that is subject to wear. The head portion 3 of the wear node contains an integrated circuit 9 that is adapted to interface the sensor with a separate gateway node. The integrated circuit 9 includes a microcontroller for processing sensor data and controlling the transceiver for wireless communication. The energy harvesting circuit is adapted to convert kinetic energy, such as vibratory movement at the component, into electrical energy that is sufficient to power the wear node 1. An antenna 11 is placed at the apogee of the top part of the wear node 1 to enable RF communication with a gateway node that is located outside of the apparatus.

Figure 3:
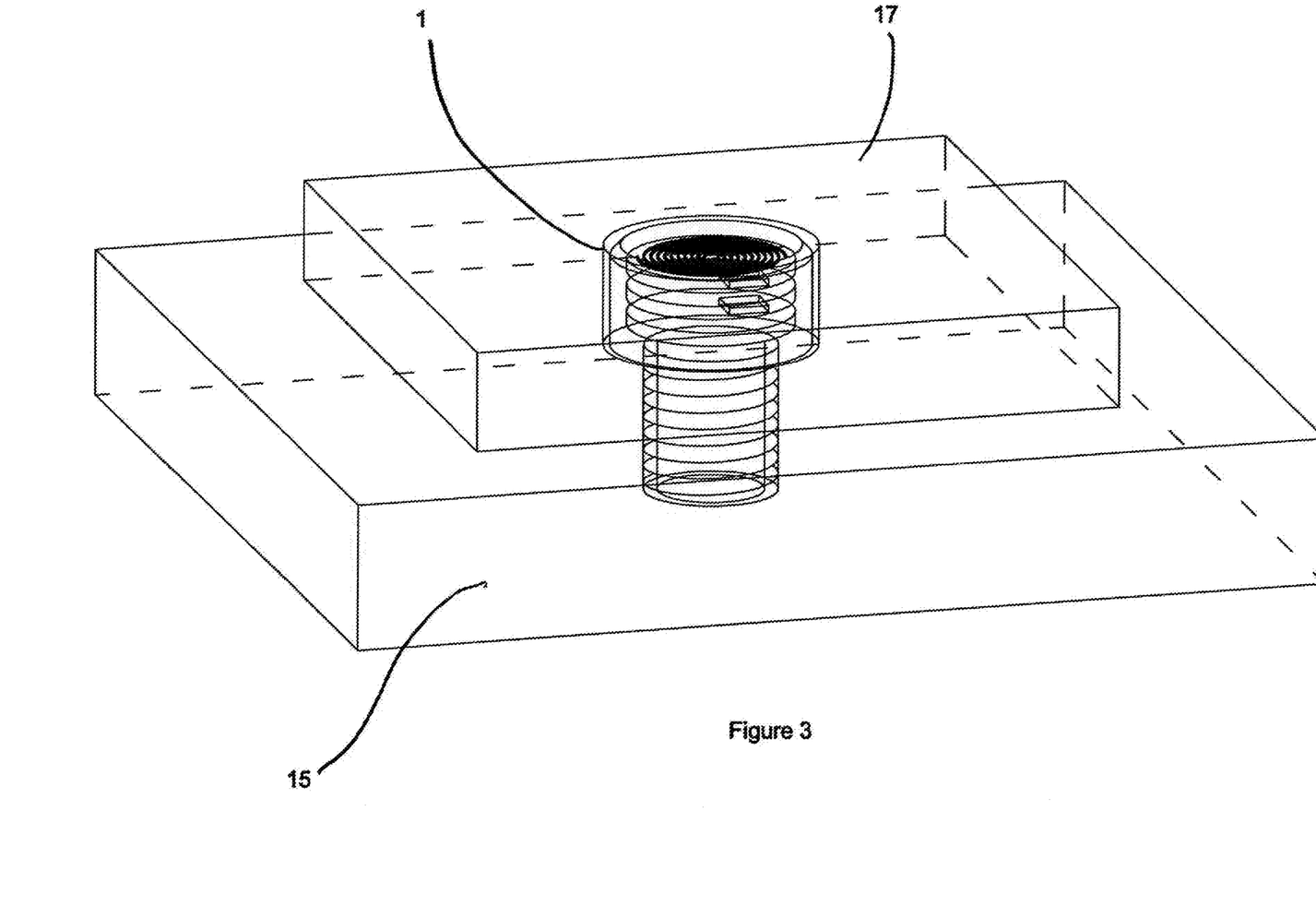
FIG. 3 shows an example of the sensor node as shown in FIG. 2 installed in a component that is subject to wear inside an apparatus.

FIG. 3 shows a typical application of the wear sensor node 1 shown in FIG. 1 in place within a wear component 15 attached to an apparatus 17. As the wear plate is ablated, so too is the shank portion of the wear sensor node 1.

Figure 4:
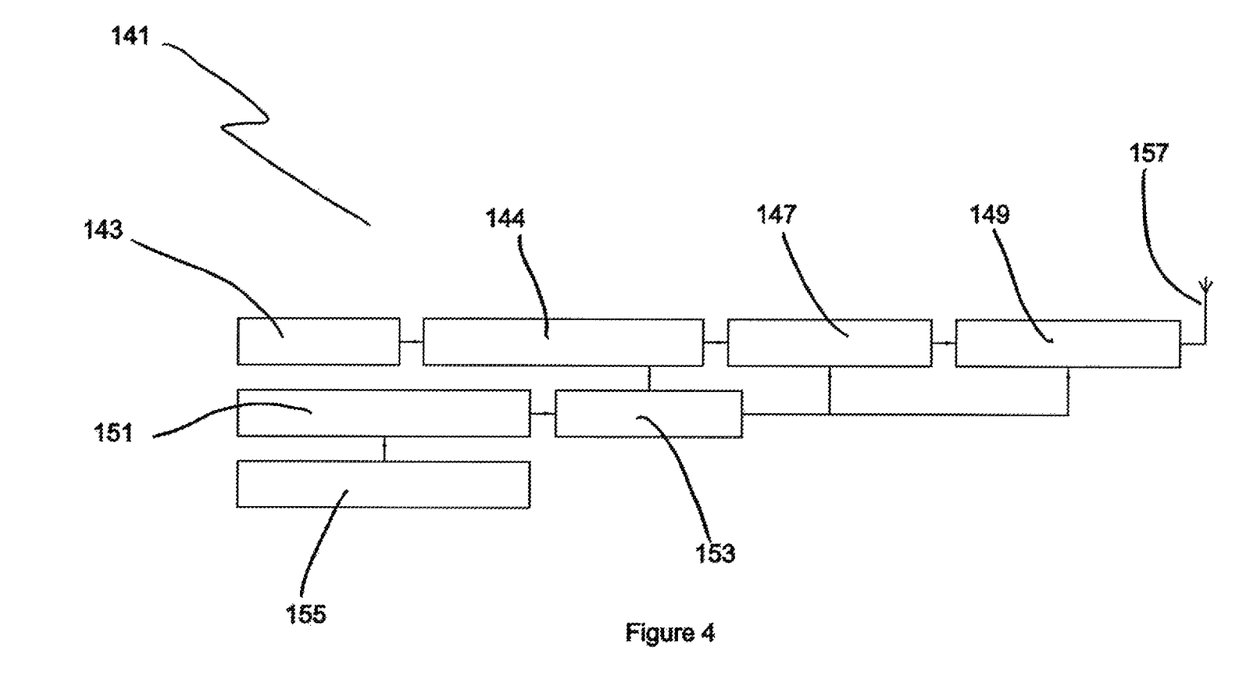
FIG. 4 shows a functional block diagram of a miniature, embedded and wireless wear sensor node in accordance with the present invention.

Turning to FIG. 4, we are shown a functional block diagram of a miniature, embedded and wireless wear sensor node 141. The sensor node 141 consists of a wear sensor 143, a sensor interface circuit 144, a microcontroller 147 and a transceiver circuit 149. Ancillary to this is a power management circuit 151 and energy storage means 153. In this embodiment, oscillatory movement of the apparatus on which the sensor node is attached, is captured via the energy harvesting means 155. The energy harvesting means 155 converts oscillatory, or vibratory motion into electrical energy. The data acquired by the sensor node 141 is communicated wirelessly via antenna 157.

Figure 5:
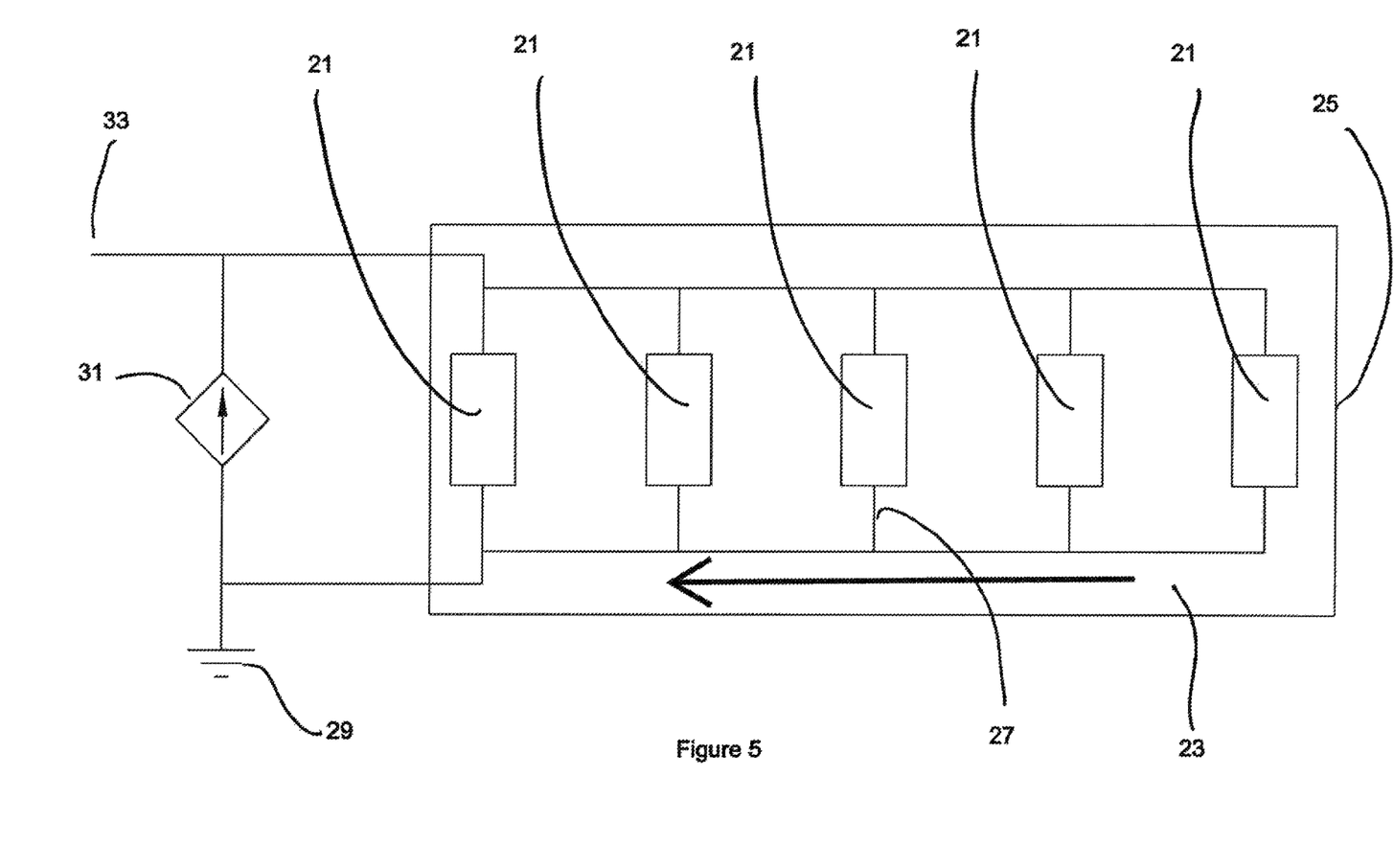
FIG. 5 is a schematic of yet another embodiment of a sensor node in accordance with the present invention.

An alternative embodiment of a sensor node is shown in FIG. 5. In this figure we can see that that the wear sensor node in this embodiment is based on electrical resistive, and/or capacitance, and/or inductance techniques which utilises discrete resistors, capacitors, or inductors 21 coupled with each other across conductive wires in a ladder arrangement. The discrete elements, such as resistors, capacitors, or inductors, 21 are placed on a printed circuit board 23 that is subject to wear by the flow of abrasive materials during operation of the apparatus. The wear on the material as well as on the PCB decouples elements from the circuit in sequence, starting with the component 21 nearest to the wear face 25. As each component is in turn disabled, a resulting change in overall resistance, capacitance, or inductance occurs. A sensor interface circuit having a current source 31 can be utilised to measure the voltage change due to change in overall resistance, capacitance, or inductance, and this information is processed by the system to give an indication of the wear state of that particular component within the apparatus. The voltage is measured at the voltage output 33. The circuit is grounded at 29.

Figure 6:
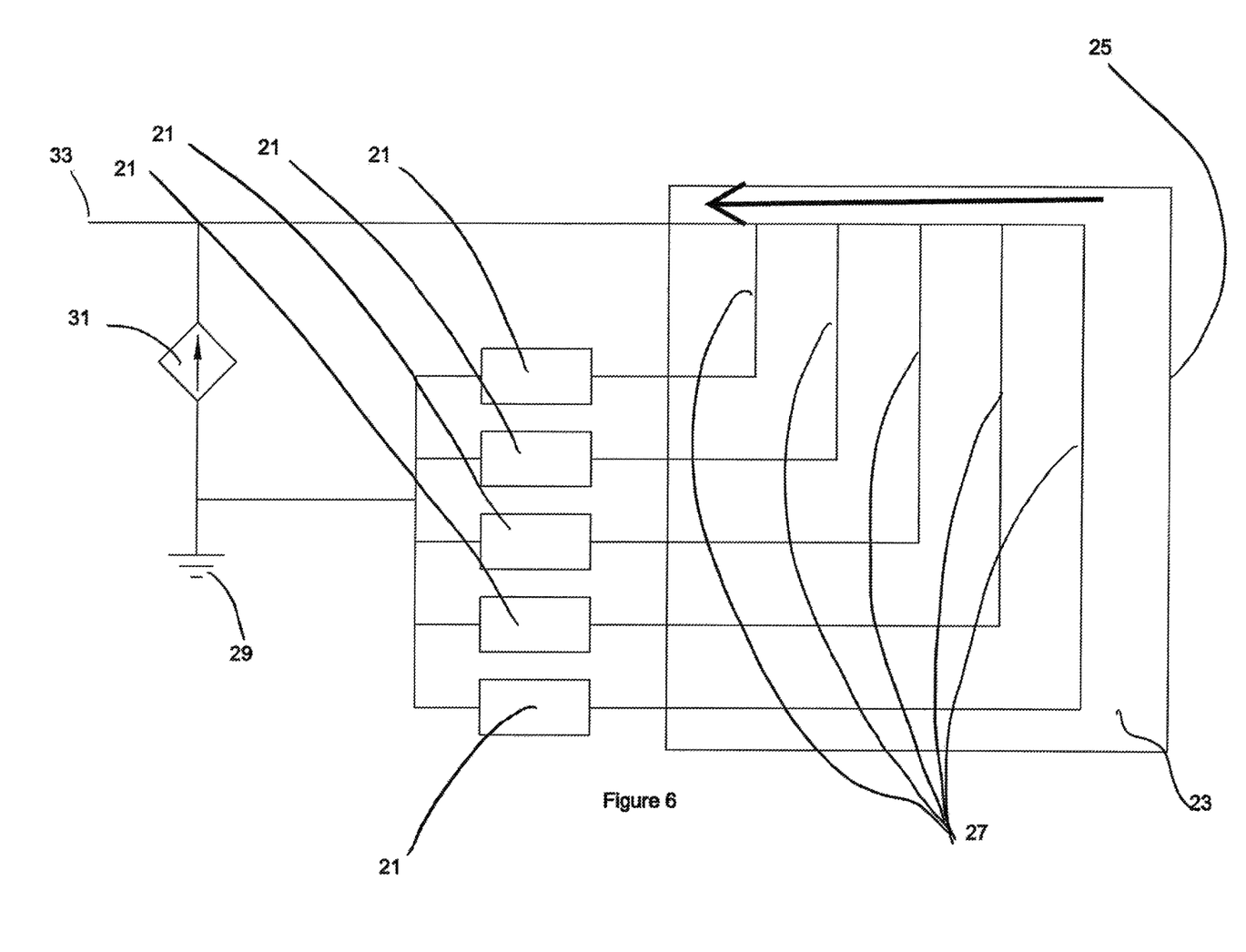
FIG. 6 is a schematic of yet another embodiment of a sensor node in accordance with the present invention.

In a slightly modified configuration shown in FIG. 6, conductive wires or rails 27 are arranged with respect to wear face 25 instead of the discrete elements 21 shown in FIG. 5. Instead, the conductive wires or rails 27 form parallel connections to discrete components 21 on the printed circuit board 23. The erosion of wear face 25 causes a corresponding wear of the printed circuit board 23 that eventually causes a sequence of disconnection of wires connected to the electrical components 21 thereby resulting in an increase in overall resistance, capacitance, or inductance of the circuit. This change is processed by the system and indicates the wear state of that particular component within the apparatus.

Figure 7A:
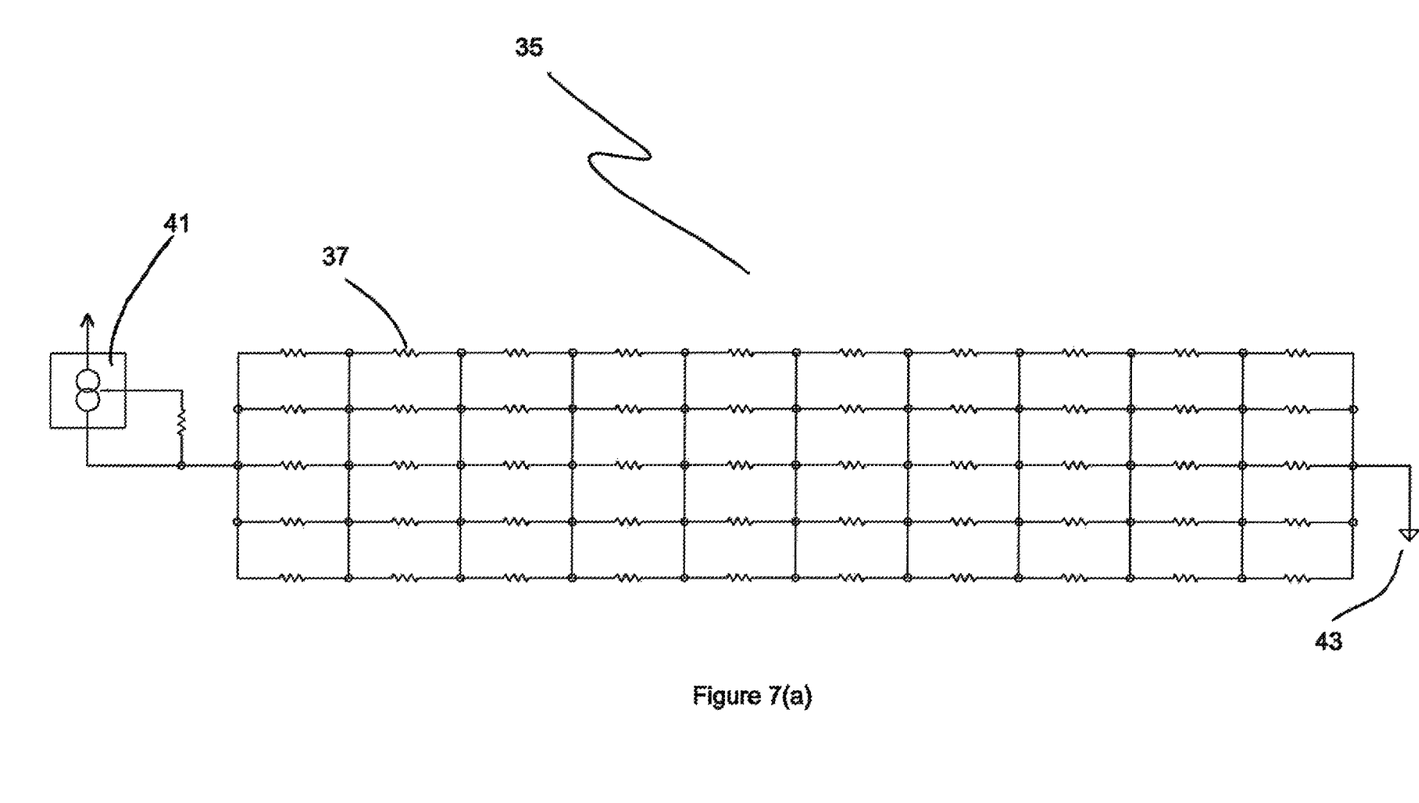
FIGS. 7(a) and (b) show an alternative embodiment of a wear sensor node utilising a resistive wire loop.
Figure 7B:
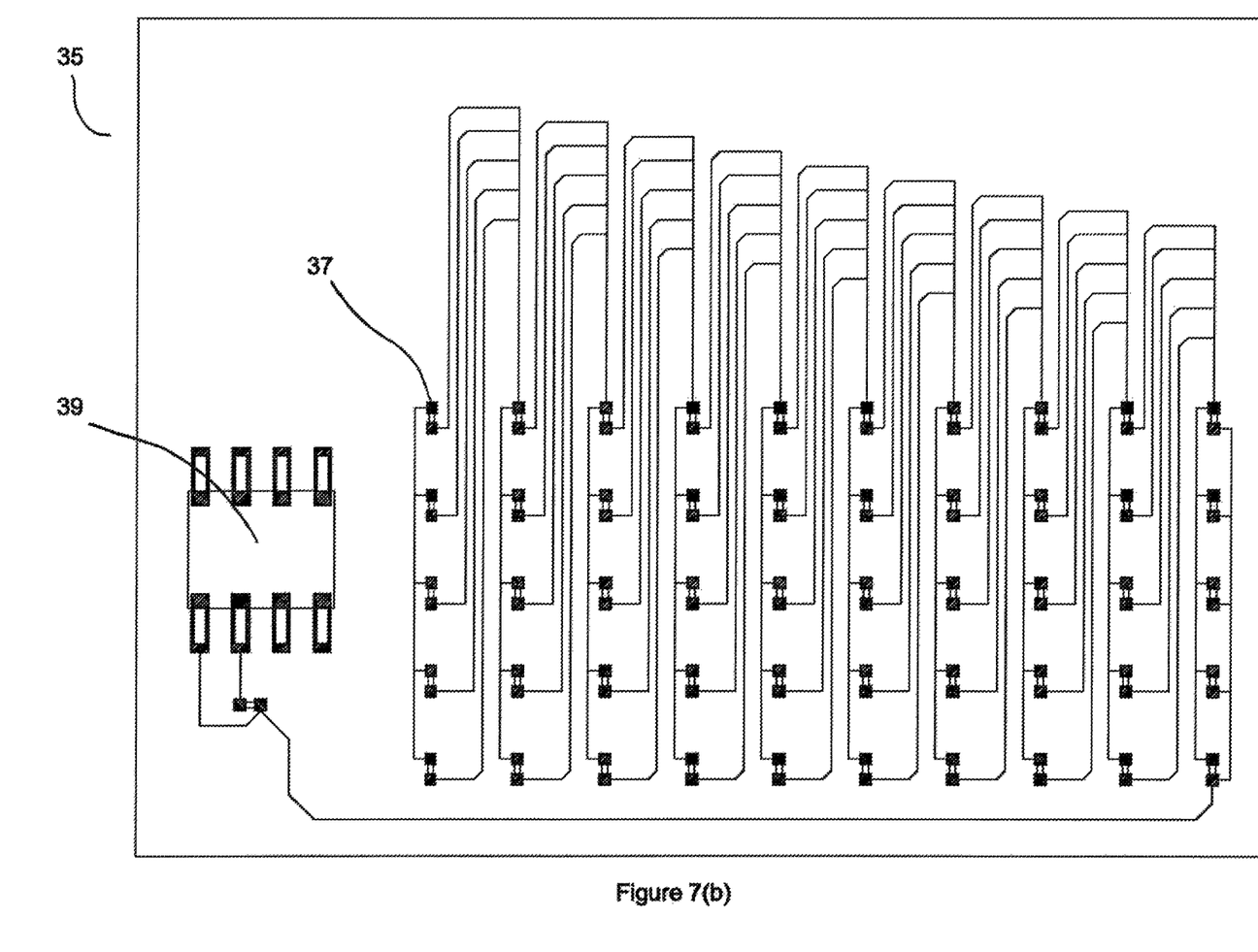

An alternative embodiment of a wear sensor node is shown in FIGS. 7(a) and (b). In this embodiment, a conductive wire loop 35 with multiple series and parallel connected resistor components 37, is shown. As shown in FIG. 7(a) we have a matrix of resistors 37 that are arranged in parallel and in series. One end is earthed and the opposite end has current source 41 that flows through the matrix and is earthed at 43. In FIG. 7(b) we also have a matrix of parallel and series connected resistors 37. This embodiment also includes a current source circuit 39 If this arrangement is viewed as a matrix having M rows and N columns, successive abrasion disconnects components from the circuit starting from first row and first column. If components have equal resistance of R, the disconnection of resistor at i-th row and j-th column will produce an equivalent resistance of $$R\frac{N(M-i)+j}{(M-i)(M+1-i)}$$

which increases monotonically with progressing wear. An electrical current source operating at DC can produce equivalent measurable voltage output that corresponds to the wear state. As an added precaution, since heavy abrasion may deposit conductive or metal particles and plastic deformation at the tip of the sensor resulting in short circuits and consequently produce an error in measurements, this arrangement can address this issue using series connected components. The conductive wires or traces can also be wrapped around a cylindrical material or rod separated by insulating materials to reduce the overall space requirement as well as to place precisely perpendicular to the wear surface.

Figure 8:
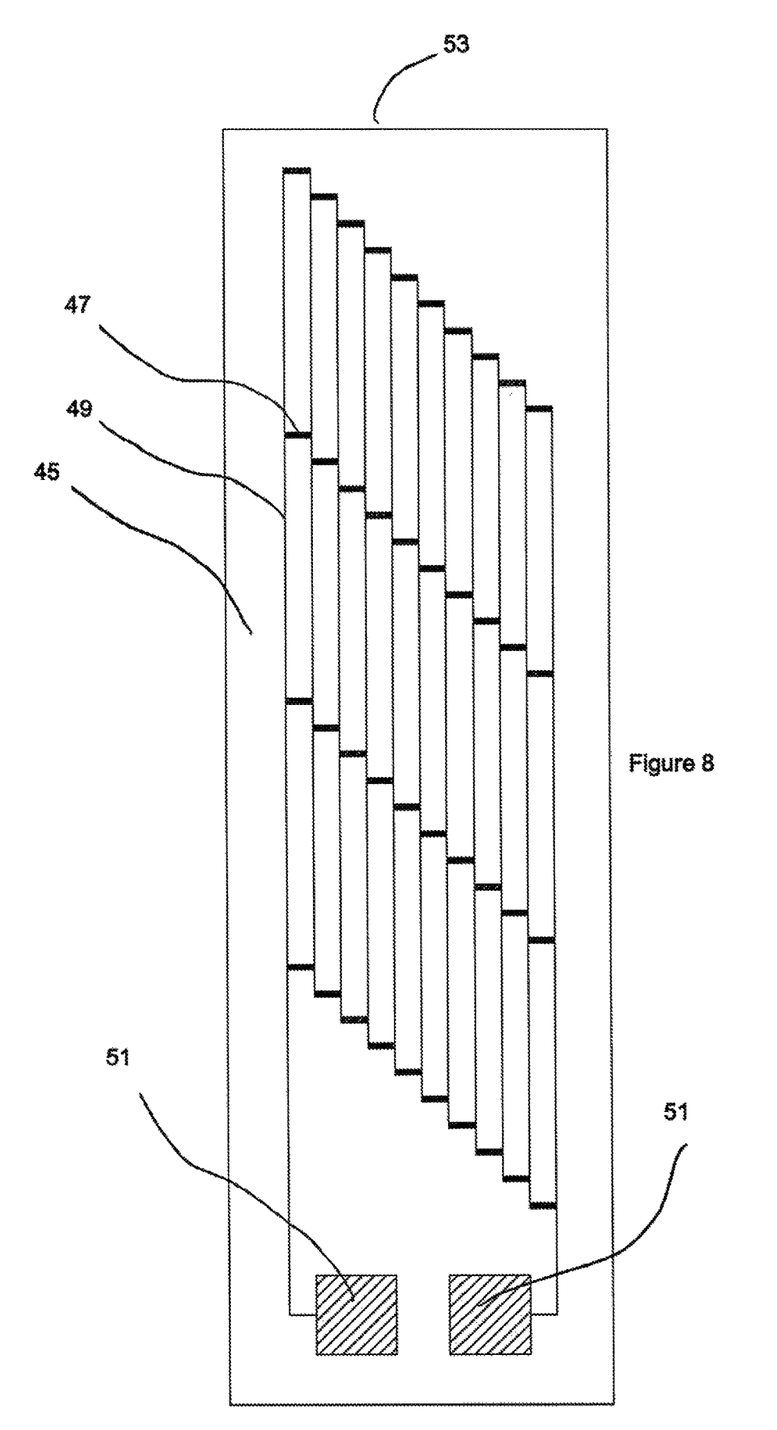
FIG. 8 is a schematic of yet another embodiment of a sensor node in accordance with the present invention.

In FIG. 8 we are shown yet another embodiment of a wear sensor using nanotechnology-based resistors 47 and associated conductive connecting rails 49. This embodiment significantly enhances the sensing resolution by at least 100-fold compared to all existing approaches. The specific resistance values are fabricated on standard silicon or glass wafer 45 by depositing different materials using standard e-Beam evaporation, sputtering, or a PECVD process along the conductive connection lines so that the space requirements for physical discrete resistors can be eliminated. Moreover, the width of the connection lines and spacing between lines can be very low, approximately 1 μm compared to conventional rail at approximately 100 μm. This enables an ultra-compact and high-resolution sensor node to be developed. This arrangement is suitable for accurate placement of conductive wires perpendicular to the wear surface. This technique facilitates the design of low-cost, low-power, and compact direct wear sensor with maximum resolution. The wear sensor includes a pair of connector pads 51 and the wear face is indicated by 53.

Figure 9:
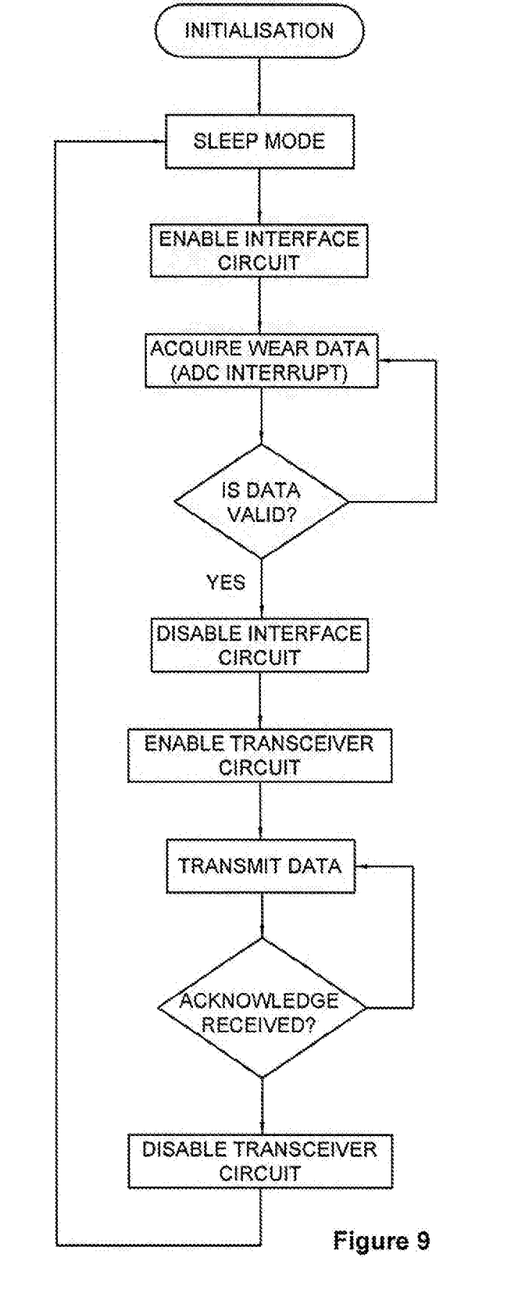
FIG. 9 shows a flow chart of the wireless wear sensor system algorithm.

In a preferred embodiment the microcontroller that is used in the sensor node as previously discussed in FIG. 2 uses ADC to measure the voltage levels originated from the sensor interface circuit corresponding to wear state. The microcontroller also controls the sensor interface circuit and the transceiver circuit to operate it in active mode during data transmission and reception and in sleep mode during other times to reduce energy consumption. The microcontroller also becomes active for a brief period of time to measure and transmit data at a defined intervals. A flow chart of the wireless wear sensor system algorithm is shown in FIG. 9. The microcontroller is initialised when power is on. Then sleep mode is enabled for a predefined time to reduce the power consumption. The sensor interface circuit is enabled to measure and collect the wear data. When valid data is obtained, interface circuit is turned off and the transceiver is turned on for data transmission. The measured data is transmitted using transceiver circuit and an antenna. After the data is transmitted, the transceiver act as a receiver to acquire acknowledgement data from external transceiver system. If the acknowledgement data is not received within a predefined time, the data is transmitted again until acknowledgement data is received. After successful transmission, the transceiver circuit is disabled and the microcontroller enters into sleep mode for a predefined time to reduce the power consumption. This algorithm is implemented in the microcontroller to conserve power for extended operation as well as to control the system and process data. The transceiver circuit and microcontroller along with intelligent algorithm can be implemented to design communication protocol such as LoRa and Bluetooth.

Figure 10:
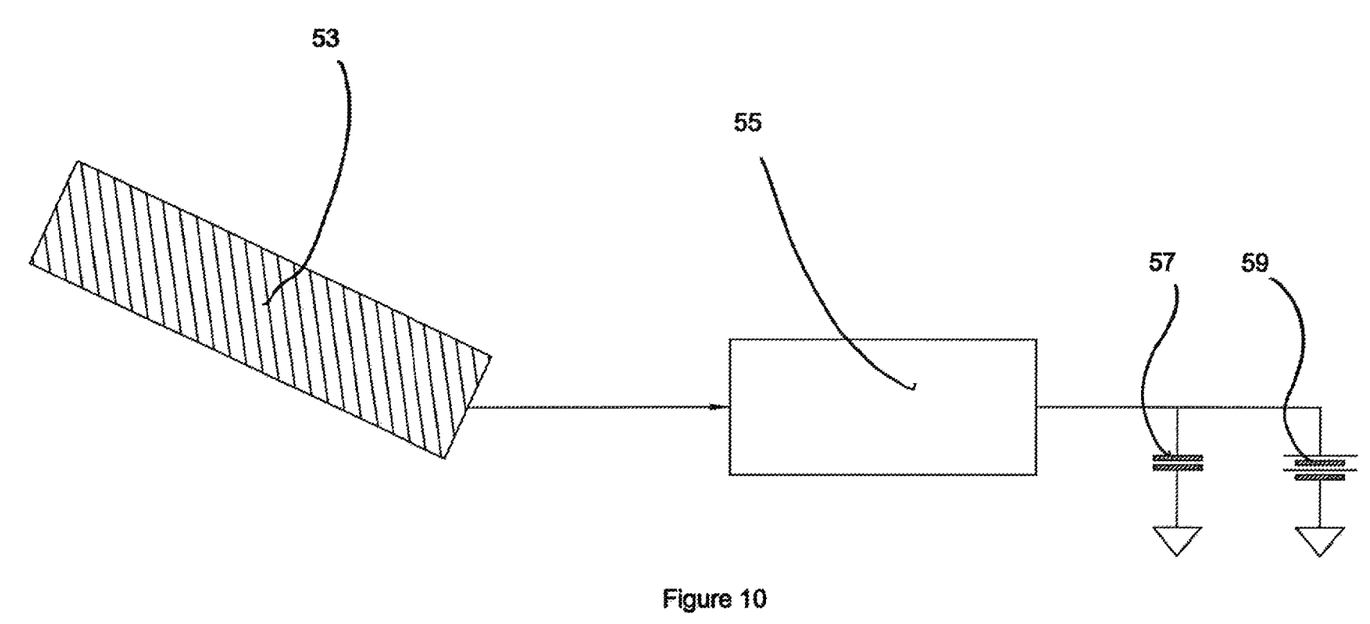
FIG. 10 shows a Piezoelectric material based device that is adapted to convert oscillatory mechanical energy from apparatus into electrical energy.

A Piezoelectric material based device is shown in FIG. 10. This technology is used to convert oscillatory mechanical energy from suitable machines and equipment into electrical energy. Please note that a suitable machine includes any machine in any industry. This invention is not just restricted to the mining industry. Since this energy harvesting device produces alternating current, a power management circuit is required to rectify and to regulate the obtained power with high efficiency. In this case, a commercial IC (LTC3588) from Linear Technology can be used. The harvested energy can be stored in energy storage devices such as capacitors, super-capacitors, solid-state batteries, or rechargeable batteries. Since the machines and equipment provide vibration energy while in operation, the energy storage devices keep on accumulating energy. In this embodiment, the piezoelectric material 53 converts oscillations it experiences as the machinery is operated, into electrical power. The piezoelectric energy harvesting integrated circuit 55 harvests the energy produced and that energy is stored in capacitor 57. The harvested energy is capable of delivering the required power to sensor interface circuit, microcontroller, and transceiver circuit to provide frequent and regular (hourly) measurements.

Please note that some, or all, of the sensors in the wear sensing and monitoring system may utilise wired or wireless communication means. Also, it is within the scope of the present invention for the sensor node and the gateway node to be housed in the same device.

While the above description includes the preferred embodiments of the invention, it is to be understood that many variations, alterations, modifications and/or additions may be introduced into the constructions and arrangements of parts previously described without departing from the essential features or the spirit or ambit of the invention.

It will be also understood that where the word "comprise", and variations such as "comprises" and "comprising", are used in this specification, unless the context requires otherwise such use is intended to imply the inclusion of a stated feature or features but is not to be taken as excluding the presence of other feature or features.

The reference to any prior art in this specification is not, and should not be taken as, an acknowledgment or any form of suggestion that such prior art forms part of the common general knowledge.

The invention claimed is:

1. A wear sensing and monitoring system for monitoring and measuring wear in an apparatus including:
   at least one sensor node, and
   wireless communication circuitry and antenna, and
   a gateway node, and
   a remote monitoring and management node,
   wherein at least the at least one sensor node and the wireless communication circuitry and antenna are housed within a housing, and wherein said housing is adapted to be releasably fastenable to a wear part of said apparatus so that the wear sensing and monitoring system can monitor the wear condition of said apparatus wear part over time, and wherein said housing is adapted to convert oscillatory or vibratory movement experienced by said apparatus wear part during operation of the apparatus into electrical energy that is sufficient to power the at least one sensor node and wireless communication circuitry and antenna, and wherein the gateway node and remote monitoring and management node are separate from said housing.

2. The wear sensing and monitoring system as defined in claim 1 wherein a plurality of housings are releasably installable into a particular apparatus, and each at least one sensor node in each housing is adapted to have at least one-way wireless communication to the gateway node.

3. The wear sensing and monitoring system as defined in claim 2 wherein each sensor node, in the plurality of sensor nodes includes a unique identification means that enables the particular sensor node to be identified by the remote monitoring and management node.

4. The wear sensing and monitoring system as defined in claim 3 wherein the gateway node includes:
   a transceiver circuit, and
   data processing and control circuitry, and
   a cellular modem, and
   an antenna,
   wherein the transceiver circuit is adapted to receive the at least one-way wireless communication from the at least one sensor node, and wherein the data processing and control circuitry is adapted to process the data emanating from the at least one sensor node and pass that processed data to the remote monitoring and management node via the cellular modem and antenna.

5. The gateway node for use in the wear sensing and monitoring system as defined in claim 4 wherein said gateway node includes an analogue to digital converter that is adapted to measure the voltage levels that correspond to the individual sensor's wear state.

6. The gateway node for use in the wear sensing and monitoring system as defined in claim 4 wherein it includes power management means that are adapted to autonomously energise and de-energise the sensor node interface and/or the cellular modem to minimise power consumption, and if/when said gateway node is running on battery power, then the time between battery recharges is maximised.

7. The gateway node as defined in claim 6 wherein the gateway node includes a microcontroller that is adapted to energise the gateway node at pre-set intervals and transmit sensor data to the remote monitoring and management node.

8. The wear sensing and monitoring system as defined in claim 1 wherein said sensor node includes:
   a body, and
   at least one antenna, and
   a circuit board, and
   at least one microcontroller chip, and
   at least one power supply, and
   a wear sensor,
   wherein the body wholly contains the at least one antenna, and the circuit board, and the at least one microcontroller chip, and the at least one power supply, and the wear sensor.

9. The sensor node for use in the wear sensing and monitoring system as defined in claim 8 wherein said sensor node includes:
   a plurality of discrete resistors, and/or
   a plurality of capacitors and/or inductors, and wherein a particular resistor in the plurality of discrete resistors or a particular capacitor or inductor in the plurality of capacitors or inductors are electrically coupled with one another in a ladder arrangement by individual electrical connections, and wherein each of the resistors, capacitors or inductors are mounted upon a printed circuit board, and wherein the printed circuit board is adapted to be subjected to physical wear during the operation of the apparatus, and wherein as the printed circuit board physically wears away, at least one of the individual electrical connections coupling either a resistor, and/or capacitor, and/or inductor are physically broken thereby resulting in a corresponding change in the sensor node's overall resistance, and/or capacitance, and/or inductance, and this change is monitored by the gateway node as indicative of the wear of the element upon which the sensor node is releasably fastened to.

10. The sensor node as defined in claim 9 wherein the physical wear on the printed circuit board is progressive, and as the wear progresses along the printed circuit board, individual components, or electrical connectors are broken or decoupled, thereby providing the sensor node with a plurality of either resistive, and/or capacitive, and/or inductive states, and these state changes are communicated with and monitored by the gateway node and used to determine the wear state of the particular component within the apparatus.

11. The sensor node for use in the wear sensing and monitoring system as defined in claim 8 wherein said sensor node includes a nest of conductive wire loops and each loop within the nest of conductive wire loops includes multiple series and parallel connected electrical components, and wherein the nest of conductive wire loops are arranged so that each of the conductive wire loops are physically disabled in sequence, by the abrasion, starting with the outermost conductive wire loop, so that as the abrasive wear continues, the resistance increases monotonically, and a direct current voltage source applied to the sensor node correspondingly makes the voltage change by the increase in the resistance, and this is measured by the gateway node and is used by the gateway node to determine the wear state of that particular component within the apparatus.

12. The sensor node for use in the wear sensing and monitoring system as defined in claim 11 including a nano-technology based resistive loop wherein said resistive loop is fabricated on a silicon or glass wafer by depositing different materials using conventional nanofabrication techniques such as e-Beam evaporation, or sputtering, or Plasma-enhanced chemical vapor deposition (PECVD) techniques to fabricate nano-resistors at discrete locations along a plurality of electrical connection lines, thereby eliminating the need to use comparatively larger conventional resistor components.

13. The sensor node as defined in claim 12 wherein the electrical connection lines are comparatively much smaller than conventional electrical connection lines when using conventional resistor components, and thereby said more electrical connection lines are able to be more densely packed within the sensor node so that the sensor node has many more resistive states as the sensor node physically wears away, and said many more resistive states is able to be monitored by the gateway node to determine more accurate wear information for that particular sensor node.

14. The sensor node for use in the wear sensing and monitoring system as defined in claim 8 wherein the at least one power supply includes Piezoelectric material and wherein the said at least one power supply is adapted to generate a sufficient electrical current to run the electronics incorporated within the sensor node by converting vibratory oscillations generated by the operation of the apparatus into electrical power.

15. The sensor node for use in the wear sensing and monitoring system as defined in claim 1 wherein the releasable fastening means includes an external thread that is adapted to screw into a complimentary hole with a corresponding internal thread in the apparatus.

16. The sensor node as defined in claim 15 wherein the body is shaped like a bolt, with a head portion and a shank portion, and wherein the releasable fastening means are included on the shank portion.

17. The sensor node as defined in claim 16 wherein the at least one antenna, printed circuit board, and the at least one microcontroller chip are contained within the head portion of the body.

* * * * *